(12) United States Patent
Kirshner et al.

(10) Patent No.: US 7,688,132 B2
(45) Date of Patent: Mar. 30, 2010

(54) METHOD AND APPARATUS FOR RF INPUT COUPLING FOR INDUCTIVE OUTPUT TUBES AND OTHER EMISSION GATED DEVICES

(75) Inventors: Mark Frederick Kirshner, Redwood City, CA (US); Richard Donald Kowalczyk, San Mateo, CA (US); Craig Bisset Wilsen, Redwood City, CA (US)

(73) Assignee: L-3 Communications Corporation, San Carlos, CA (US)

( * ) Notice: Subject to any disclaimer, the term of this patent is extended or adjusted under 35 U.S.C. 154(b) by 16 days.

(21) Appl. No.: 11/946,718

(22) Filed: Nov. 28, 2007

(65) Prior Publication Data

US 2008/0122531 A1 May 29, 2008

Related U.S. Application Data

(60) Provisional application No. 60/867,756, filed on Nov. 29, 2006.

(51) Int. Cl.
H01J 25/02 (2006.01)
(52) U.S. Cl. .................. 330/44; 315/5.33; 315/5.37
(58) Field of Classification Search .......... 315/5.37, 315/5.33; 330/44, 45
See application file for complete search history.

(56) References Cited

U.S. PATENT DOCUMENTS

| | | | |
|---|---|---|---|
| 2,857,480 A * | 10/1958 | Mihran et al. ............... 330/45 |
| 3,609,247 A | 9/1971 | Halstead |
| 3,803,442 A | 4/1974 | Epsztein et al. |
| 4,032,865 A | 6/1977 | Harp et al. |
| 4,527,091 A * | 7/1985 | Preist ........................ 315/5 |
| 5,545,949 A | 8/1996 | Bacher |
| 5,629,582 A | 5/1997 | Dobbs |
| 5,698,949 A | 12/1997 | Lien et al. |
| 6,380,803 B2 * | 4/2002 | Symons ...................... 330/45 |
| 6,998,783 B2 | 2/2006 | Symons |
| 2003/0052612 A1 | 3/2003 | Tanabe |

* cited by examiner

Primary Examiner—Benny T. Lee
(74) Attorney, Agent, or Firm—O'Melveny & Myers LLP

(57) ABSTRACT

An input circuit of a microwave amplification tube achieves improved instantaneous bandwidth. By directly coupling the transmission line carrying a modulating radio frequency signal to a control grid, a low-Q input circuit is created that increases the fractional bandwidth of the system. A resonant cavity may be used to generate a voltage across the gap between the cathode and the control grid. Alternative geometries are presented whereby the electron beam is emitted from a cathode connected either to the center conductor of the transmission line or to the outer conductor of the transmission line. Alternatively, the electric field of the radio-frequency signal propagating through the transmission line may be used to create a voltage across the gap between the cathode and the control grid without using a resonant cavity. Likewise, alternative geometries are presented by which the electron beam is emitted from a cathode connected either to the center conductor or to the outer conductor of the transmission line.

16 Claims, 7 Drawing Sheets

PRIOR ART

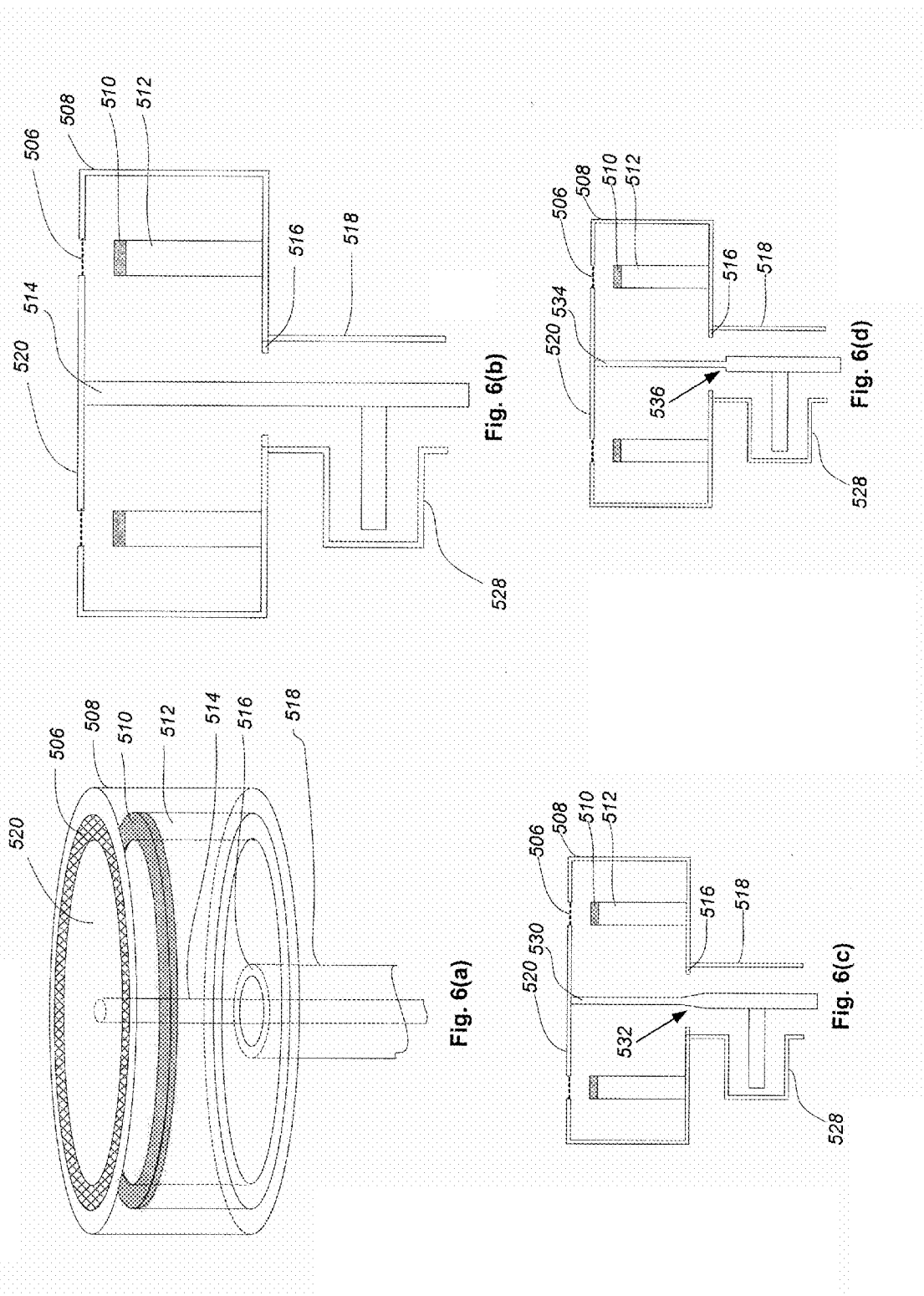

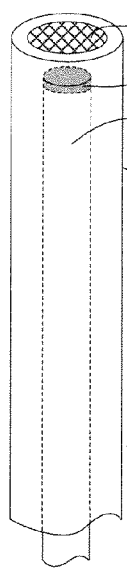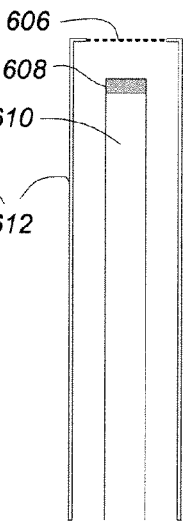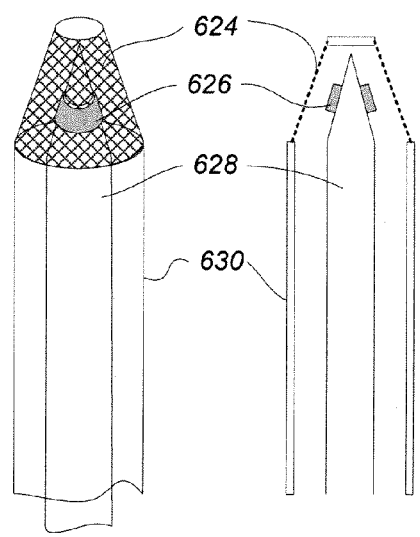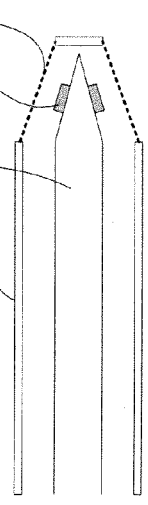
Fig. 7(a)　　　Fig. 7(b)　　　Fig. 7(c)　　　Fig. 7(d)
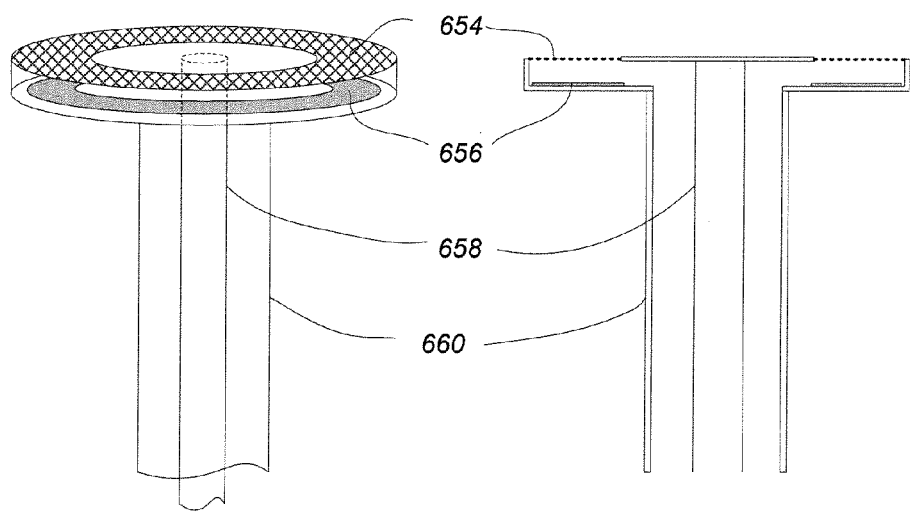
Fig. 7(e)　　　Fig. 7(f)

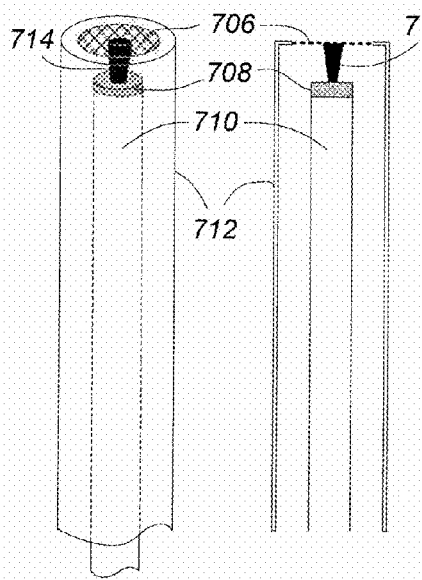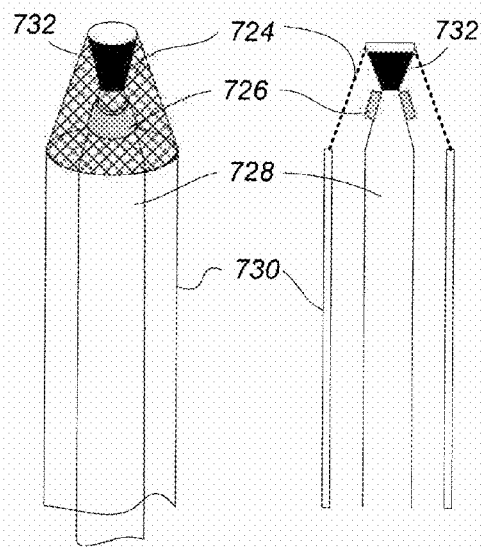
Fig. 8(a)  Fig. 8(b)  Fig. 8(c)  Fig. 8(d)
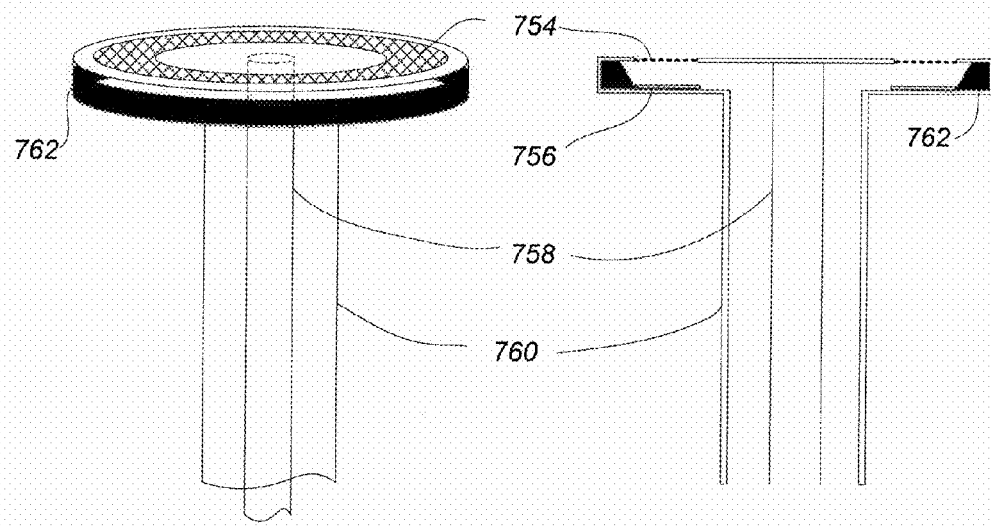
Fig. 8(e)  Fig. 8(f)

METHOD AND APPARATUS FOR RF INPUT COUPLING FOR INDUCTIVE OUTPUT TUBES AND OTHER EMISSION GATED DEVICES

RELATED APPLICATION DATA

This application claims the benefit, pursuant to 35 U.S.C. § 119(e), of U.S. provisional application Ser. No. 60/867,756, filed Nov. 29, 2006.

BACKGROUND OF THE INVENTION

1. Field of the Invention

The present invention relates to microwave amplification tubes, such as an inductive output tube (IOT), and, more particularly, to an input circuit for an IOT or other emission-gated device providing improved instantaneous bandwidth.

2. Description of Related Art

It is well known in the art to utilize a linear beam device, such as a klystron or traveling wave tube amplifier, to generate or amplify a high-frequency RF signal. Such a device generally includes an electron-emitting cathode and an anode spaced therefrom. The anode includes a central aperture, and by applying a high voltage potential between the cathode and anode, electrons may be drawn from the cathode surface and directed into a high-power beam that passes through the anode aperture. One class of linear beam device, referred to as an inductive output tube (IOT), further includes a grid disposed in the inter-electrode region defined between the cathode and anode. The electron beam may thus be density modulated by applying a radio-frequency (RF) signal to the grid relative to the cathode. After the anode accelerates the density-modulated beam, the beam propagates across a gap provided downstream within the IOT, and RF fields are thereby induced into a cavity coupled to the gap. The RF fields may then be extracted from the output cavity in the form of a high-power, modulated RF signal.

More particularly, an IOT, as well as other emission-gated microwave amplifiers, use density modulation to establish an AC current $J_b$ on the electron beam directly at the cathode surface. This current is subsequently converted to RF energy through the $J_b \cdot E_c$ interaction with the output circuit field, $E_c$. Density-modulated amplifiers are highly efficient, even when operated in the linear region. Direct modulation of the beam at the cathode also enables compact device size.

In most density-modulated devices, RF gating of the electron emission is accomplished via an input cavity structure with a high-electric-field region situated between the cathode surface and a control grid. Energy from the signal generator is coupled into the input circuit, modulating the electron beam at the grid-to-cathode (g-k) gap. The basic elements of the input circuit are a resonant cavity, a coupled transmission line and a DC block. The gain-bandwidth product is limited by the interaction impedance R/Q·Q, where R/Q is the shunt impedance across the g-k gap, primarily determined by the gap geometry, and Q is the quality factor. The Q, proportional to the ratio of stored energy to dissipated power, determines the bandwidth of interaction between the drive signal and the electron beam. The power is dissipated by cavity ohmic losses, beam loading and external loading. The total Q is thus the parallel combination of the ohmic quality factor $Q_0$, the beam loading quality factor $Q_b$ and the external quality factor $Q_{ext}$. When heavily loaded by the generator impedance through the transmission line, the cavity is strongly coupled and has a correspondingly low $Q_{ext}$. This reduces the total Q, which increases the bandwidth.

The input resonant cavity can be modeled as a parallel RLC circuit. The beam is included as a shunt impedance and the connection to the drive line is represented by a transformer with a turns ratio of N. The $Q_{ext}$ is related to the turns ratio by:

$$N^2 Z_0 = R/Q \cdot Q_{ext},$$

where $Z_0$ is the characteristic impedance of the input transmission line. Driven at its resonant frequency $\omega_0$, the cavity presents a purely resistive load of magnitude R/Q·Q to the signal generator, where R/Q is the shunt impedance across the g-k gap. As the drive frequency is shifted away from $\omega_0$, the load becomes increasingly reactive, and the resistive component decreases. At a small offset $\Delta\omega$ from the center frequency, the load impedance is given by:

$$Z_{load} = \frac{R}{1 + 2jQ\Delta\omega/\omega_0}$$

When the real component of the load impedance has dropped to half of its value at resonance, or R/2, the power delivered by the generator will be halved. This occurs when $\Delta\omega/\omega_0 = 1/(2Q)$. Hence, the fractional bandwidth of a resonant cavity, defined as the distance between the two half-power points divided by $\omega_0$, is given by the reciprocal of the total quality factor (1/Q).

The coupling transformer connecting the signal generator to the resonant cavity is typically implemented using an inductive loop to transfer power from the signal generator to the cavity. The degree of coupling is proportional to the ratio of the magnetic flux enclosed by the inductive loop to the total flux in the cavity. A resonant cavity is formed around the electron gun in the IOT, with the g-k gap supporting the electric fields that modulate the electron beam. The electron beam passing through the grid is bunched at the frequency of the input signal. Electrons are accelerated towards a positively biased anode before their energy is extracted by the output circuit. For existing IOT applications, such as UHF television broadcast, loop coupling provides adequate bandwidth of a few percent. Practical limits on the loop size prevent substantially larger bandwidths from being achieved. Hence, if a wide-bandwidth IOT were possible, the compactness and linearity of this device would make it an attractive option for many other applications.

Accordingly, it is highly desirable to improve the instantaneous bandwidth of the input circuit of an IOT or other density-modulated device.

SUMMARY OF THE INVENTION

The instantaneous bandwidth achievable in an IOT or other density-modulated device is increased by employing an input circuit that directly couples the radio frequency signal carried by an input coaxial transmission line to the control grid. Such a directly coupled system comprises a coaxial transmission line with one conductor connected directly to the cathode and the other connected directly to the control grid, DC isolation being provided by an appropriately located DC block. Intermediate coupling methods, such as inductive loops or capacitive probes, are not used. Several methods exist for implementing the directly coupled system. One class of implementations utilizes a resonant cavity to generate a voltage between the cathode and the control grid. In its most basic topology, the center conductor of the transmission line is connected to the cathode, while the outer conductor of the transmission line is connected to the outside wall of the resonant cavity, the outside wall also serving to support the control grid and to provide an electrical connection between the outer conductor and the control grid. In another topology employing a resonant cavity, the cathode takes the form of an annular ring supported by an annular cathode support structure within the resonant cavity. The outer conductor of the coaxial transmission line is connected to the cathode support structure. The center conductor of the coaxial transmission line extends through the center of the resonant cavity and connects to the top of the cavity, which also serves as a grid support structure, holding an annular control grid in place in close proximity to the cathode and providing an electrical connection between the grid and the center conductor of the transmission line.

In both of these topologies, the impedance mismatch between the coaxial transmission line and the resonant cavity can be tuned by employing several techniques. First, an iris can be positioned at the location where the outer conductor of the coaxial transmission line joins the resonant cavity. The iris has an opening with a diameter that is smaller than that of the outer conductor of the transmission line but larger than the diameter of the center conductor, allowing the center conductor to pass through the iris. The effect of the iris is to change the magnitude of the capacitive discontinuity that appears at the transition from the coaxial transmission line to the resonant cavity. Second, various transmission line filters, well known to those skilled in the art, may be employed to change the impedance of the coaxial transmission line. For example, a slug tuner, or a parallel- or series-connected coaxial filter, such as a quarter-wave tuning stub, may be employed on the coaxial transmission line.

Another class of implementations support a voltage between the cathode and the control grid without the use of a resonant cavity. In this class of implementations, the electric field propagating in the coaxial transmission line directly generates a time-varying voltage across the grid-to-cathode gap. In one non-resonant topology, the cathode is connected to the center conductor of the coaxial transmission line while the grid is connected to the outer conductor in such a way that it is positioned in close proximity to the cathode. The center conductor may terminate in a right circular cylinder, or may be shaped to affect the impedance of the transmission line and the position of the cathode attached to it.

In another non-resonant topology, the cathode is connected to the outer conductor of the transmission line while the grid connects to the center conductor. To implement this, the coaxial transmission line transitions to a radial transmission line and the cathode takes the form of an annular ring connected to the bottom conductor of the radial transmission line. The control grid also takes on an annular form and is supported by the upper conductor of the radial transmission line, which also provides an electrical connection to the center conductor of the coaxial transmission line.

In both of these topologies, the impedance of the coaxial transmission line can be tuned by employing slug tuners or coaxial transmission line filters as described above. Furthermore, the transmission line can be terminated by the electron beam alone or in combination with a resistive termination disposed between the cathode and the control grid.

A more complete understanding of the directly coupled system providing increased operating bandwidth to IOTs and other density-modulated electron beam devices will be afforded to those skilled in the art, as well as a realization of additional advantages and objects thereof, by consideration of the following detailed description of the preferred embodiment. Reference will be made to the appended sheets of drawings which will first be described briefly.

BRIEF DESCRIPTION OF THE DRAWINGS

FIG. 6(a) is a perspective drawing of an alternative embodiment of the direct coupling system, and FIG. 6(b) is a cross-sectional view of this alternative embodiment;

FIGS. 6(c) and 6(d) are drawings of alternative embodiments of the embodiment of FIG. 6(a) in which the center conductor is tapered, and in which the center conductor is stepped, respectively;

FIGS. 7(a)-7(f) are alternative embodiments of the non-resonant direct coupling system terminated in the beam impedance; and FIGS. 8(a)-8(f) are alternative embodiments of the non-resonant direct coupling system terminated in a resistive load.

DETAILED DESCRIPTION OF THE PREFERRED EMBODIMENT

The invention provides improved instantaneous bandwidth of the input circuit of an IOT or other density-modulated device. In the detailed description that follows, like numbers are used to describe like elements illustrated in one or more of the figures.

Figure 1:
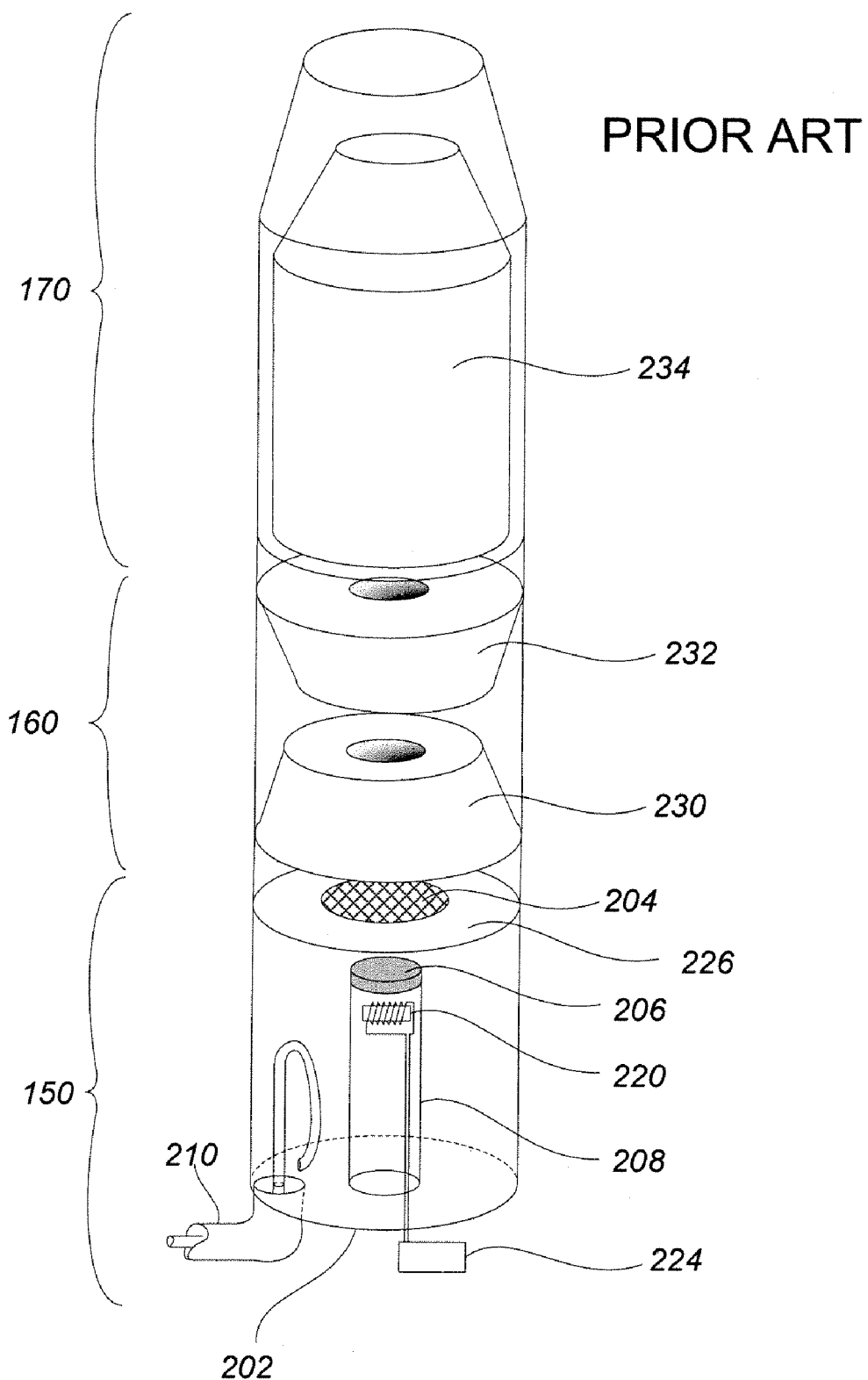
FIG. 1 is a perspective schematic drawing of a conventional IOT.
Figure 3:
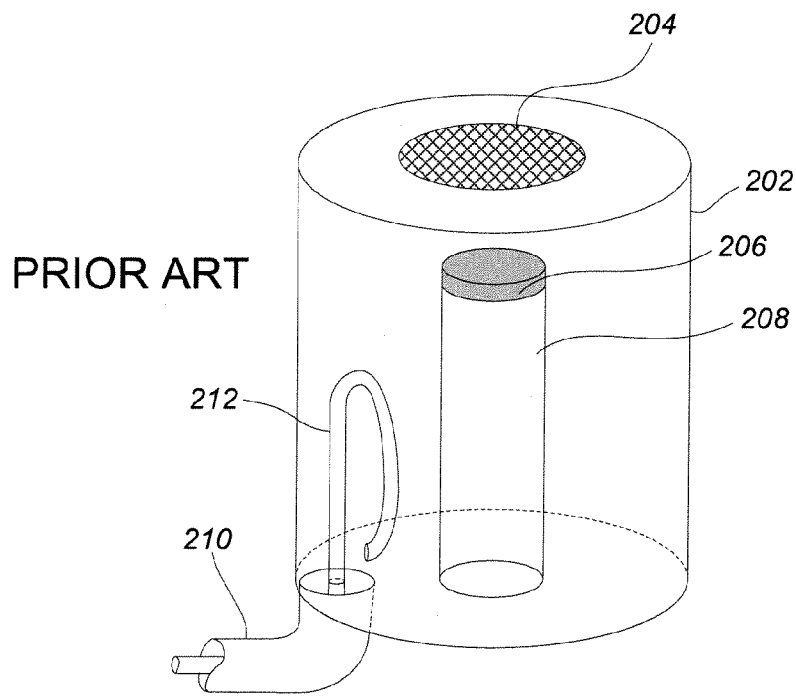
FIG. 3 is a schematic layout of a conventional loop coupling in an IOT input circuit.

FIG. 1 is a schematic drawing of an exemplary IOT, typical of the prior art. The IOT includes three major sections, including an electron gun 150, a tube body 160, and a collector 170. The electron gun 150, shown in more detail in FIG. 3, provides an axially directed electron beam that is density modulated by an RF signal. Now returning to FIG. 1, the electron beam passes through a first drift tube 230 and a second drift tube 232 and then passes into an inner structure 234 inside the collector 170 that collects the spent electron beam. The electron gun further includes a cathode 206 with a closely spaced control grid 204. The cathode is disposed at the end of a cathode support structure 208 that includes an internal heater coil 220 coupled to a heater voltage source 224. The control grid 204 is positioned closely adjacent to the surface of the cathode 206, and is coupled to a bias voltage source to maintain a DC bias voltage relative to the cathode. A resonant input cavity 202 receives an RF input signal via a coaxial transmission line 210. The RF signal is coupled between the control grid 204 and cathode 206 to density modulate the electron beam emitted from the cathode 206. The control grid is physically held in place by a grid support structure 226. An example of an input cavity for an inductive output tube is provided by U.S. Pat. No. 6,133,786, the subject matter of which is incorporated in its entirety by reference herein.

Figure 2:
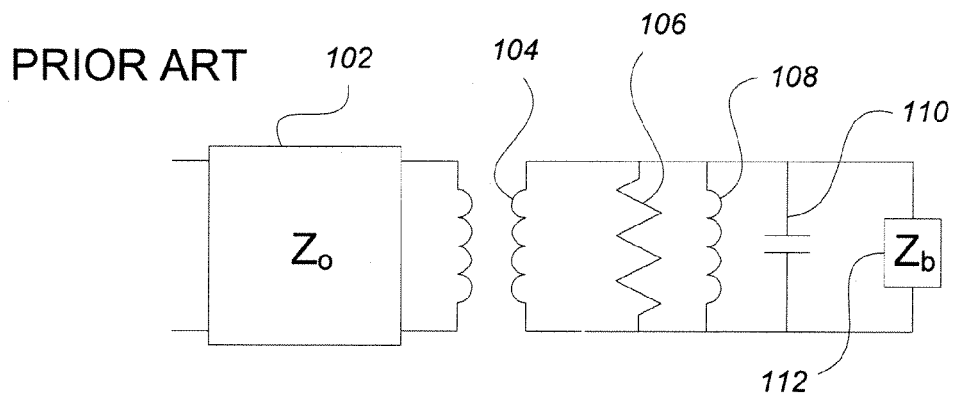
FIG. 2 is a parallel RLC circuit model, characterizing a conventional input transmission line coupled to a resonant cavity with beam impedance $Z_b$.

FIG. 2 depicts a parallel RLC circuit model of a conventional input circuit of the prior art. The electron beam is modeled as a shunt impedance 112 of the beam impedance $Z_b$, and the resonant cavity is modeled as a parallel combination of a resistor 106, an inductor 108, and a capacitor 110. The input transmission line 102, with a characteristic impedance of $Z_0$, is coupled to the resonant cavity via an inductive loop, modeled as a transformer 104, with an effective turns ratio of N. As discussed previously, this results in a load impedance presented to the input transmission line due to the cavity of $$Z_{load} = \frac{R}{1 + 2jQ\Delta\omega/\omega_0},$$

where $\Delta\omega$ represents a small offset from the cavity resonant frequency $\omega_0$. Using this expression to calculate the half power points, the fractional bandwidth of the system is obtained as 1/Q, where Q is the quality factor.

FIG. 3 represents an exemplary physical layout of the conventional prior-art input circuit modeled in FIG. 2. The coupling transformer is implemented as an inductive loop 212 that couples energy from the input coaxial transmission line 210 into the resonant cavity 202. The cathode 206 is situated atop a cathode support structure 208 to place it in close proximity to a control grid 204 that permits passage of the electron beam emitted by the cathode 206. The cavity geometry places practical limitations on loop size, and as a consequence, limits the fraction of the magnetic flux that is intercepted, restricting this technique to applications requiring relatively narrow bandwidths.

The invention described herein discloses a method for coupling to the input circuit of an IOT or other emission-gated device that allows for a substantially lower $Q_{ext}$ that is able to achieve substantially greater bandwidths. This is achieved by providing a coaxial transmission line that directly couples to the cavity surrounding the grid-to-cathode interaction region. This direct coupling results in a relatively low external quality factor ($Q_{ext}$) that reduces the total Q, increasing the bandwidth of the input circuit.

Figures 4A, 4B:
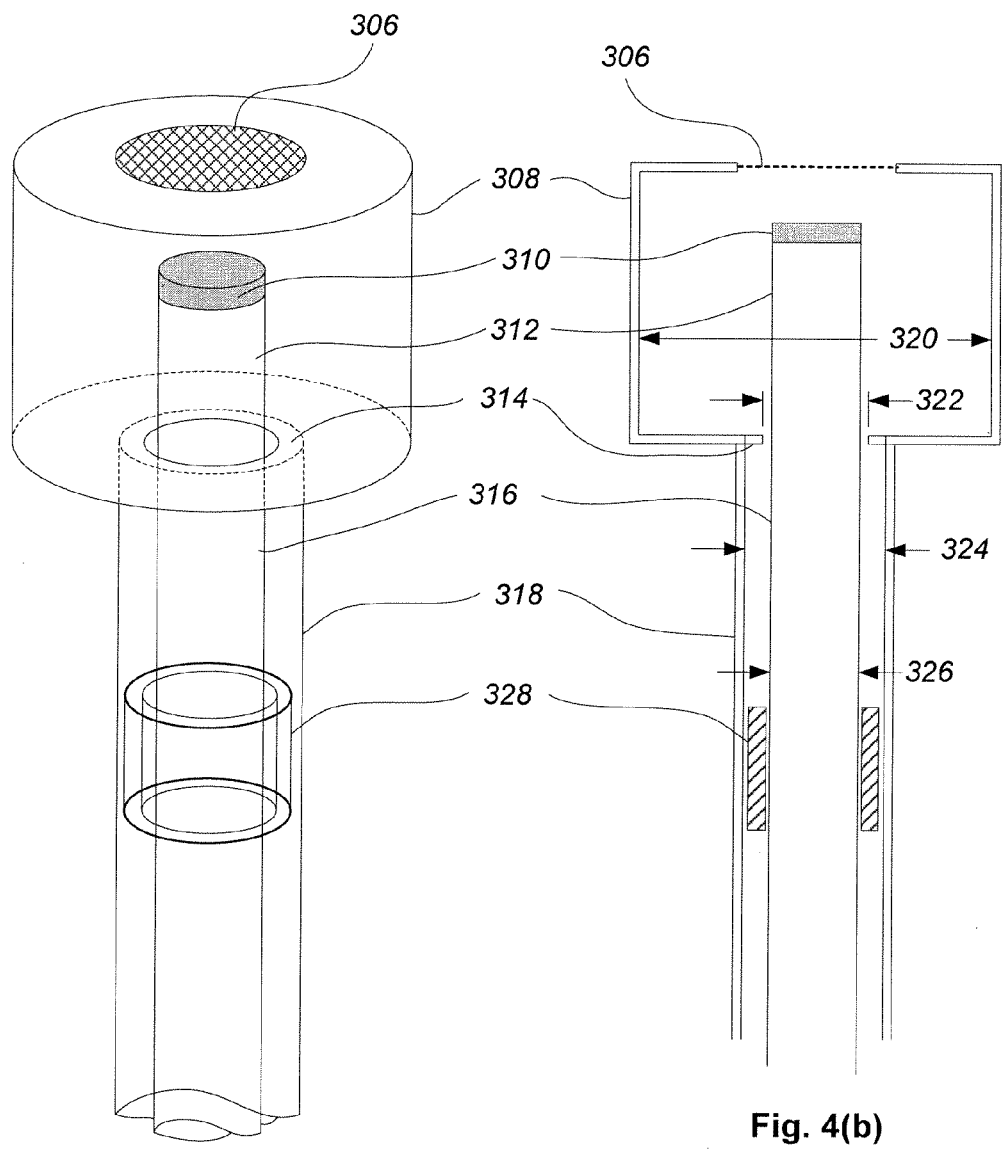
FIG. 4(a) is a perspective drawing of a direct coupling system in an IOT input circuit in accordance with an embodiment of the invention.
FIG. 4(b) is a cross-sectional view of a directly coupled input circuit.

Several implementations of the directly coupled input circuit are possible. The most basic embodiment of the invention is shown in FIGS. 4(a) and 4(b). FIG. 4(a) presents a three-dimensional view of the input circuit, and FIG. 4(b) presents an axial cross-sectional view of the input circuit. Like numbers are used to refer to corresponding structures between the two figures. In this embodiment, the center conductor 316 of the coaxial input transmission line transitions to the cathode support structure 312, and the outer conductor 318 is connected to the outside wall of the cavity 308. A control grid 306 is connected to the wall of the cavity 308 and held in close proximity to the cathode 310, which is situated at the top of the cathode support structure 312. A DC block is located between the outer conductor 318 and the grid 306 to enable a DC bias to be maintained between the grid 306 and the cathode 310 while permitting direct coupling of the RF signal from the transmission line to the grid. An optional iris 314, in the form of an annular ring, may be disposed at the location where the outer conductor 318 of the transmission line joins the cavity wall 308. The diameter of the opening of the iris 314 is larger than the diameter of the cathode support structure 312, but smaller than the diameter of the outer conductor 318. In the discussion that follows, the radius of the iris opening having diameter 322 is represented by $r_a$. The radius of the resonant cavity having diameter 320 is represented by $r_c$. The inner radius of the outer conductor having diameter 324 and the radius of the center (inner) conductor having diameter 326 of the transmission line are represented by $r_o$ and $r_i$, respectively. Though FIGS. 4(a) and 4(b) depict a center conductor that is a right circular cylinder in shape, the center conductor may be stepped or tapered, such as the center conductor depicted in FIG. 7(c), in order to modify the impedance of the coaxial transmission line.

Figure 4C:
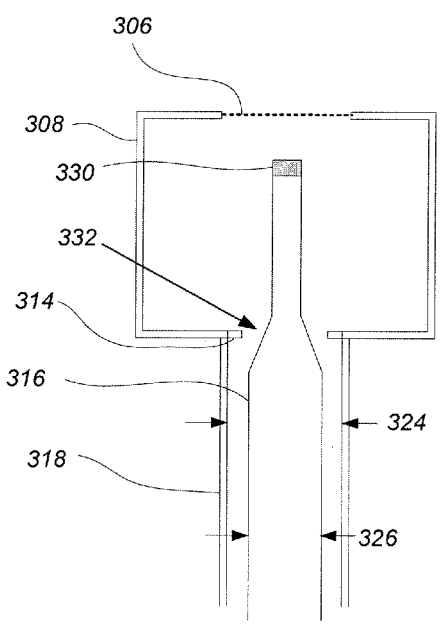
FIGS. 4(c) and 4(d) are drawings of alternative embodiments of a direct coupling system in an IOT output circuit in which the center conductor is tapered, and in which the center conductor is stepped, respectively.
Figure 4D:
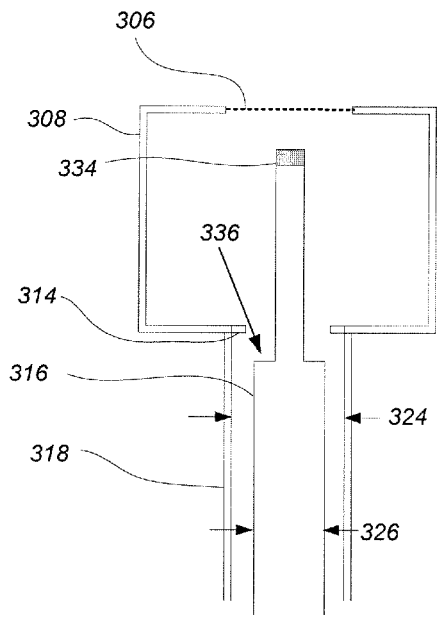

FIG. 4(c) depicts an alternative embodiment having a center conductor 316 supporting a cathode 330, wherein the center conductor 316 has a taper 332. FIG. 4(d) depicts an alternative embodiment having a center conductor 316 supporting a cathode 334, wherein the center conductor 316 has a step 336. In both FIGS. 4(c) and 4(d), a control grid 306 is connected to the cavity wall 308. Dimension arrows 324 indicate the inner diameter of the outer conductor 318, and dimension arrows 326 indicate the diameter of the center conductor 316 prior to the taper 332 or the step 336 shown in FIGS. 4(c) and 4(d), respectively. An iris 314 may be disposed at the location where the outer conductor 318 joins the cavity wall 308.

Figure 5:
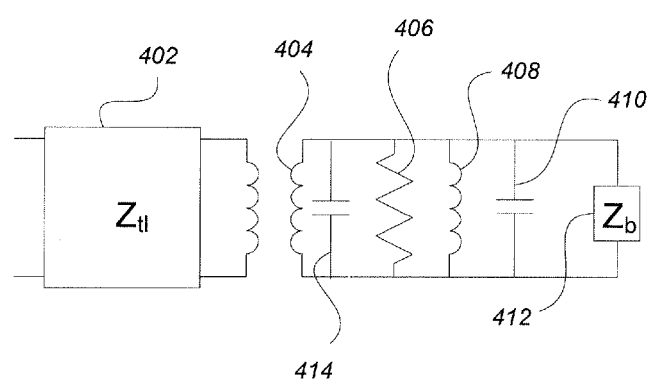
FIG. 5 is a parallel RLC circuit model of an input transmission line coupled to a resonant cavity, including the discontinuity capacitance, $C_d$, that accounts for the higher-order modes arising from the change in transmission line radius.

The geometry represented in FIGS. 4(a) and 4(b) can be modeled by the equivalent circuit shown in FIG. 5. The beam impedance, $Z_b$, is modeled as a shunt element 412. The cavity is modeled as a parallel RLC circuit including a resistor 406, an inductor 408, and a capacitor 410. The coupling of the coaxial transmission line 402 to the cavity is modeled as a transformer 404 as well as a shunt capacitance 414, called the discontinuity capacitance, $C_d$, to account for the higher order modes excited at the impedance step that results from the change in diameter as a signal leaves the coaxial transmission line and enters the resonant cavity. The turns ratio of the transformer, N, is approximately $$N^2 \approx Z_{cp}/Z_{tl}.$$

The cavity port impedance, $Z_{cp}$, and the transmission line impedance, $Z_{tl}$, are given by $$Z_{cp} = [(\mu/\epsilon)^{1/2}/2\pi]\ln(r_c/r_i), \text{ and}$$

$$Z_{tl} = [(\mu/\epsilon)^{1/2}/2\pi]\ln(r_o/r_i),$$

where $r_0$ and $r_c$ are the radii of the outer conductor 318 of the coaxial transmission line and the resonant cavity 308 respectively, and $r_i$ is the radius of the center (inner) conductor 316. The calculation of the discontinuity capacitance, $C_d$, requires a full field solution. The $Q_{ext}$ of the cavity is defined as $Q_{ext} = \omega_0 U/P_l$, where U is the energy stored in the cavity and $P_l$ is the power dissipated in the transmission line load.

This power, defined as $P_l = \frac{1}{2} I^2 R$, requires calculation of the current, I, flowing out of the cavity into the transmission line. The shunt capacitance in parallel with this load acts as a current divider. The fraction of the current that flows through the transmission line load is $1/(\alpha^2+1)$, where $\alpha = N^2 Z_{tl} \omega_0 C_d$. Since Q is inversely proportional to $I^2$, the reduction in current modifies the $Q_{ext}$ defined above, resulting in:

$$Q_{ext} = \frac{N^2 Z_{tl}}{R/Q}(\alpha^2 + 1)^2$$

For a typical design at L-band, the discontinuity capacitance is on the order of 0.1 picofarads, resulting in $\alpha \approx 0.1$, and hence $Q_{ext} \approx Z_{cp}/R/Q$. Depending on the specific geometry, very low $Q_{ext}$, approaching unity, can be achieved.

If an iris 314 is included, where $r_a < r_0$, the discontinuity capacitance is increased, shunting a larger portion of the current and increasing the $Q_{ext}$ without changing the cavity or transmission line geometry. A tapered or stepped transmission line or other impedance transformer may be used in place of, or in conjunction with, the iris to change the transmission line impedance presented to the cavity. Placement of a filter network in the transmission line offers further control of the bandwidth. An example of this, well known to those skilled in the art, is a coaxial impedance transformer, such as a slug tuner, on the center of the transmission line. FIG. 4(*a*) depicts a dielectric slug tuner 328 used to tune the impedance of the input line. Another example of such a filter network is a transmission line resonant cavity, connected either in series or in parallel, such as the tuning stub 528 depicted in FIG. 6(*b*).

FIGS. 6(*a*) and 6(*b*) illustrate a second embodiment of the direct coupling system. A three dimensional view is depicted in FIG. 6(*a*), and a cross-sectional view is presented in FIG. 6(*b*). Like numbers are used to refer to corresponding structures. A ring cathode 510 is mounted on an annular support structure 512, and this support structure is connected to the outer conductor 518 of the transmission line. The center conductor 514 of the transmission line extends through the cavity and is connected to a grid support structure 520 that supports an annular control grid 506 and further provides an electrical connection between the center conductor 514 and the control grid 506. A DC block is located between the outer conductor 518 and the grid 506 to enable a DC bias to be maintained between the grid 506 and the cathode 510 while permitting direct coupling of the RF signal from the transmission line to the grid. An optional iris 516 may be used to alter the magnitude of the discontinuity capacitance between the coaxial transmission line and the cavity 508. An optional stub tuner 528, shown in FIG. 6(*b*), may likewise be used to tune the impedance of the coaxial transmission line to alter the magnitude of the discontinuity capacitance. Using a coaxial impedance transformer, a cold test model of this embodiment has been fabricated and tested, and has achieved an instantaneous bandwidth in excess of twenty percent.

FIG. 6(*c*) depicts an alternative embodiment having a center conductor 530 that has a taper 532. FIG. 6(*d*) depicts an alternative embodiment having a center conductor 534 that has a step 536. In both FIGS. 6(*c*) and 6(*d*), an annular control grid 506 is supported by grid support structure 520. An iris 516 may be located where the outer conductor 518 joins the cavity 508. An annular cathode support structure 512 supports the annular cathode 510. A stub tuner 528 may be used to tune the impedance of the transmission line.

The voltage across the grid-to-cathode gap need not be provided by a resonant cavity. Instead, the electric field of the transmission line mode may be used to generate the voltage in a non-resonant directly coupled system. A portion of the power carried by the transmission line is coupled into the electron beam. Termination of the transmission line in its characteristic impedance results in maximum bandwidth. The termination can be provided by the beam as illustrated in FIGS. 7(*a*)-7(*f*), by a resistive load located after the beam as illustrated in FIGS. 8(*a*)-8(*f*), or by some combination of the two. A transmission line transformer, such as a slug tuner or resonant cavity filter, may be used to facilitate the match.

FIGS. 7(*a*)-7(*f*) show three possible embodiments of the non-resonant direct coupling system. FIG. 7(*a*) represents a three-dimensional view and FIG. 7(*b*) represents a cross-sectional view of a cylindrical non-resonant directly coupled system. The cathode 608 is disposed at the end of the center conductor 610 of the input coaxial transmission line. The outer conductor 612 of the transmission line is connected to the control grid 606. The voltage across the grid-to-cathode gap, between the cathode 608 and grid 606, is provided by the electric field of the electromagnetic wave traveling in the coaxial transmission line. The termination of the transmission line is provided by the electron beam itself.

FIGS. 7(*c*) and 7(*d*) show an alternative embodiment in which the center conductor 628 is tapered. The cathode 626 surrounds the tapered end of the center conductor 628 and is held in close proximity to the control grid 624 that is situated around the tapered center conductor. The outer conductor 630 is connected to the control grid 624. Varying the geometry of the tapered center conductor will change the impedance of the transmission line, which is terminated by the electron beam itself.

FIGS. 7(*e*) and 7(*f*) depict an alternative embodiment of the non-resonant directly coupled system. In this embodiment, the coaxial transmission line comprising a center conductor 658 and an outer conductor 660, transitions to a radial transmission line. The center conductor 658 attaches to the annular control grid 654. The annular cathode 656 is attached to the lower wall of the radial transmission line and connected directly to the outer conductor 660 of the coaxial transmission line. In this embodiment, as well, the transmission line is terminated by the electron beam.

FIGS. 8(*a*)-8(*f*) present the same embodiments of the non-resonant direct coupling system shown in FIGS. 7(*a*)-7(*f*), except that here the termination is provided by a resistive load rather than solely by the electron beam. In FIGS. 8(*a*) and 8(*b*), the resistive load 714 is situated between the cathode 708 and the control grid 706, which are in turn attached to the center conductor 710 and the outer conductor 712, respectively. Similarly in FIGS. 8(*c*) and 8(*d*), the resistive load 732 is placed between the center conductor 728, which supports the cathode 726, and the control grid 724 that is connected to the outer conductor 730. Finally, in FIGS. 8(*e*) and 8(*f*), the resistive load 762 is situated around the outside of the radial transmission line between the cathode 756, visible in FIG. 8(*f*), connected to the outer conductor 760, and the grid 754, connected to the center conductor 758. It should be noted that the beam can be emitted from a cathode connected either to the center conductor, as shown in FIGS. 7(*a*)-7(*d*) and 8(*a*)-8(*d*), or to the outer conductor, as shown in FIGS. 7(*e*)-7(*f*) and 8(*e*)-8(*f*).

It should be appreciated that the above-described geometries are not meant to be comprehensive but are representative embodiments of the present invention that utilize direct coupling of a transmission line to achieve wideband coupling from the transmission line to the electron beam. By employing the direct coupling system, this invention enables inductive output devices to be adapted for service in wide-instantaneous-bandwidth applications. The method is also likely to spur the development of other novel emission-gated devices, employing thermionic and non-thermionic cathodes.

Having thus described a preferred embodiment of a novel input circuit that provides improved instantaneous bandwidth for an inductive output tube or other emission-gated device, it is apparent to those skilled in the art that certain advantages of such systems have been achieved. It should also be appreciated that various modifications, adaptations, and alternative embodiments thereof may be made within the scope and spirit of the present invention. The invention is further defined by the following claims.

What is claimed is:

1. A linear beam amplification device comprising:
    an electron-emitting cathode and an anode spaced therefrom, and a grid disposed between the cathode and the anode such that a grid-to-cathode interaction region is defined between the grid and the cathode, the cathode providing an electron beam in response to a high voltage applied between the cathode and the anode, the electron beam being density modulated by a radio frequency signal applied to the grid, and an input circuit operatively coupled to the grid-to-cathode interaction region comprising:
 an input cavity substantially enclosing the grid-to-cathode interaction region; and
 a coaxial transmission line adapted to apply the radio frequency signal to the grid, wherein the coaxial transmission line comprises a center conductor and an outer conductor; wherein the center conductor of the coaxial transmission line connects to the grid; and the outer conductor of the coaxial transmission line directly connects to the cathode and is terminated in at least one of:

(a) a resistive termination device; and (b) a matched load provided by the electron beam such that power in the radio frequency signal travelling in the coaxial transmission line is deposited in a resistive component of a beam impedance associated with the electron beam.

2. The linear beam amplification device of claim 1, wherein the center conductor of the coaxial transmission line comprises at least one of a stepped center conductor and a tapered center conductor.

3. The linear beam amplification device of claim 1, wherein the transmission line comprises an upper conductor and a lower conductor, the upper conductor being connected to the center conductor of the coaxial transmission line and to the grid, and the lower conductor being connected to the outer conductor of the coaxial transmission line and to the cathode.

4. The linear beam amplification device of claim 1, wherein the coaxial transmission line includes at least one of a tuning stub and a slug tuner for modifying an impedance of the coaxial transmission line.

5. A linear beam amplification device comprising:
an electron-emitting cathode and an anode spaced therefrom, and a grid disposed between the cathode and the anode such that a grid-to-cathode interaction region is defined between the grid and the cathode, the cathode providing an electron beam in response to a high voltage applied between the cathode and the anode, the electron beam being density modulated by a radio frequency signal applied to the grid, and
an input circuit operatively coupled to the grid-to-cathode interaction region comprising:
 an input cavity substantially enclosing the grid-to-cathode interaction region; and
 a coaxial transmission line adapted to apply the radio frequency signal to the grid, wherein the coaxial transmission line comprises a center conductor and an outer conductor;
wherein each of the center conductor and the outer conductor is directly connected to a respective one of the cathode and the grid without an inductive loop or capacitive probe;
wherein the input cavity further comprises a resonant cavity having a substantially cylindrical shape; and
a cathode support structure adapted to fix the position of the cathode, wherein:
 the center conductor of the coaxial transmission line connects to the cathode support structure; and
 the outer conductor of the coaxial transmission line connects to an outside wall of the resonant cavity, the outside wall of the resonant cavity further being connected to the grid; and wherein a diameter of the resonant cavity is larger than a corresponding diameter of the outer conductor of the coaxial transmission line such that a capacitive impedance discontinuity appears where the outer conductor of the transmission line is connected to the resonant cavity.

6. A linear beam amplification device comprising:
an electron-emitting cathode and an anode spaced therefrom, and a grid disposed between the cathode and the anode such that a grid-to-cathode interaction region is defined between the grid and the cathode, the cathode providing an electron beam in response to a high voltage applied between the cathode and the anode, the electron beam being density modulated by a radio frequency signal applied to the grid, and
an input circuit operatively coupled to the grid-to-cathode interaction region comprising:
 an input cavity substantially enclosing the grid-to-cathode interaction region; and
 a coaxial transmission line adapted to apply the radio frequency signal to the grid, wherein the coaxial transmission line comprises a center conductor and an outer conductor;
wherein each of the center conductor and the outer conductor is directly connected to a respective one of the cathode and the grid without an inductive loop or capacitive probe;
wherein the input cavity further comprises a resonant cavity having a substantially cylindrical shape; and
a cathode support structure adapted to fix the position of the cathode,
wherein:
 the center conductor of the coaxial transmission line connects to the cathode support structure; and
 the outer conductor of the coaxial transmission line connects to an outside wall of the resonant cavity, the outside wall of the resonant cavity further being connected to the grid;
wherein a diameter of the resonant cavity is larger than a corresponding diameter of the outer conductor of the coaxial transmission line such that a capacitive impedance discontinuity appears where the outer conductor of the transmission line is connected to the resonant cavity; and
an iris disposed at a location in which the outer conductor of the coaxial transmission line connects to the resonant cavity, wherein:
 the iris is oriented coaxially with the transmission line; and
 the iris includes a central opening, the central opening having a diameter that is smaller than the diameter of the outer conductor of the transmission line and larger than a corresponding diameter of the center conductor of the transmission line.

7. A linear beam amplification device comprising:
an electron-emitting cathode and an anode spaced therefrom, and a grid disposed between the cathode and the anode such that a grid-to-cathode interaction region is defined between the grid and the cathode, the cathode providing an electron beam in response to a high voltage applied between the cathode and the anode, the electron beam being density modulated by a radio frequency signal applied to the grid, and
an input circuit operatively coupled to the grid-to-cathode interaction region comprising:
 an input cavity substantially enclosing the grid-to-cathode interaction region; and a coaxial transmission line adapted to apply the radio frequency signal to the grid, wherein the coaxial transmission line comprises a center conductor and an outer conductor; wherein the center conductor of the coaxial transmission line directly connects to the cathode and is terminated in at least one of:

(a) a resistive termination device; and (b) a matched load provided by the electron beam such that power in the radio frequency signal travelling in the coaxial transmission line is deposited in a resistive component of a beam impedance associated with the electron beam.

8. The linear beam amplification device of claim 7, wherein the coaxial transmission line includes at least one of a tuning stub and a slug tuner for modifying an impedance of the coaxial transmission line.

9. The linear beam amplification device of claim 7, wherein the center conductor of the coaxial transmission line comprises at least one of a stepped center conductor and a tapered center conductor.

10. A linear beam amplification device comprising:

an electron-emitting cathode and an anode spaced therefrom, and a grid disposed between the cathode and the anode such that a grid-to-cathode interaction region is defined between the grid and the cathode, the cathode providing an electron beam in response to a high voltage applied between the cathode and the anode, the electron beam being density modulated by a radio frequency signal applied to the grid, and an input circuit operatively coupled to the grid-to-cathode interaction region comprising:

an input cavity substantially enclosing the grid-to-cathode interaction region; and a coaxial transmission line adapted to apply the radio frequency signal to the grid, wherein the coaxial transmission line comprises a center conductor and an outer conductor; and a cathode support structure adapted to fix the position of the cathode; wherein the center conductor of the coaxial transmission line directly connects to the cathode support structure without an inductive loop or capacitive probe;

the outer conductor of the coaxial transmission line directly connects to an outside wall of the resonant cavity, the outside wall of the resonant cavity further being connected to the grid; and a diameter of the input cavity is larger than a corresponding diameter of the outer conductor of the coaxial transmission line such that a capacitive impedance discontinuity appears where the outer conductor of the transmission line is connected to the input cavity.

11. The linear beam amplification device of claim 10, wherein the coaxial transmission line includes at least one of a tuning stub and a slug tuner for modifying an impedance of the coaxial transmission line.

12. The linear beam amplification device of claim 10, wherein the center conductor of the coaxial transmission line comprises at least one of a stepped center conductor and a tapered center conductor.

13. A linear beam amplification device comprising:

an annular electron-emitting cathode and an anode spaced therefrom, and a grid disposed between the cathode and the anode such that a grid-to-cathode interaction region is defined between the grid and the annular cathode, the annular cathode providing an electron beam in response to a high voltage applied between the annular cathode and the anode, the electron beam being density modulated by a radio frequency signal applied to the grid;

an input circuit operatively coupled to the grid-to-cathode interaction region comprising:

an input cavity substantially enclosing the grid-to-cathode interaction region; and a coaxial transmission line adapted to apply the radio frequency signal to the grid, wherein the coaxial transmission line comprises a center conductor and an outer conductor;

an annular cathode support structure adapted to fix the position of the annular cathode; and a grid support structure adapted to fix the position of the grid; wherein the annular cathode support structure is oriented coaxially with the input cavity and the transmission line;

the outer conductor of the coaxial transmission line directly connects to the cathode support structure without an inductive loop or capacitive probe; and the center conductor of the coaxial transmission line extends through the input cavity and connects to the grid support structure, the grid support structure further being electrically connected to the center conductor of the transmission line and the grid.

14. The linear beam amplification device of claim 13, wherein the coaxial transmission line includes at least one of a tuning stub and a slug tuner for modifying an impedance of the coaxial transmission line.

15. The linear beam amplification device of claim 13, wherein a diameter of the annular cathode support structure is larger than a corresponding diameter of the outer conductor of the transmission line such that a capacitive impedance discontinuity appears where the outer conductor of the transmission line is connected to the annular cathode support structure.

16. The linear beam amplification device of claim 15, further comprising an iris disposed at a location in which the outer conductor of the coaxial transmission line connects to the annular cathode support structure, wherein:

the iris includes a central opening;

the iris is oriented coaxially with the transmission line and the annular cathode support structure; and the central opening of the iris has a diameter that is smaller than the diameter of the outer conductor of the transmission line and larger than a corresponding diameter of the center conductor of the transmission line.

* * * * *